(12) United States Patent
Li et al.

(10) Patent No.: US 11,861,287 B2
(45) Date of Patent: Jan. 2, 2024

(54) INTEGRATED CIRCUIT DEVELOPMENT USING DENSITY-AWARE BORDER FILL

(71) Applicant: International Business Machines Corporation, Armonk, NY (US)

(72) Inventors: Hongmei Li, Williston, VT (US); Rasit Onur Topaloglu, Poughkeepsie, NY (US); Peter A. Smith, Wappingers Falls, NY (US); Jeremy R. Tolbert, Selkirk, NY (US)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 17/391,117

(22) Filed: Aug. 2, 2021

(65) Prior Publication Data
US 2023/0034219 A1   Feb. 2, 2023

(51) Int. Cl.
*G06F 30/392* (2020.01)
*G06F 30/398* (2020.01)

(52) U.S. Cl.
CPC .......... *G06F 30/398* (2020.01); *G06F 30/392* (2020.01)

(58) Field of Classification Search
CPC .... G06F 30/398; G06F 2119/18; G06F 30/30; G06F 30/39; G06F 30/367; G06F 2111/04; G06F 30/392; G06F 2115/08; G06F 30/3323; G06F 2111/08; G06F 2119/02; G06F 2119/10; G06F 2119/12; G06F 30/327; G06F 30/33; G06F 30/337; G06F 1/20; G06F 1/32; G06F 12/023; G06F 12/0811; G06F 12/0815; G06F 12/0862; G06F 12/0875; G06F 2119/06; G06F 2212/1016; G06F 2212/1028; G06F 2212/452; G06F 30/31; G06F 30/3308; G06F 30/373; G06F 30/394; G06F 8/443;
(Continued)

(56) References Cited

U.S. PATENT DOCUMENTS 7,152,215 B2   12/2006   Smith et al.
7,356,783 B2   4/2008    Smith et al.
(Continued)

FOREIGN PATENT DOCUMENTS

WO   2014186803 A1   11/2014

OTHER PUBLICATIONS

Gupta et al., "Merits of Cellwise Model-Based OPC", Proceedings of SPIE—The International Society for Optical Egineering, vol. 5379, May 2004, pp. 182-189.
(Continued)

*Primary Examiner* — Binh C Tat
(74) *Attorney, Agent, or Firm* — CANTOR COLBURN LLP; Samuel Waldbaum

(57) ABSTRACT

Aspects of the invention include setting a fill mode for a border region of a layer of a macro of an integrated circuit. The border region has a depth defined by a multiple of the size of a tile used to select an area of the integrated circuit for implementation of a design rule check, and the fill mode indicates a fill percentage value or level of fill to be implemented in the border region of the layer of the macro. A fill of the border region of the layer of the macro is performed based on the fill mode. The integrated circuit is finalized and fabricated based on the performing of the fill and passing the design rule check.

20 Claims, 5 Drawing Sheets

(58) Field of Classification Search
CPC ............... G06F 9/3001; G06F 9/30043; G06F 9/30065; G06F 9/30072; G06F 9/30105; G06F 9/30109; G06F 9/3012; G06F 9/30123; G06F 9/30134; G06F 9/30141; G06F 9/30181; G06F 9/30189; G06F 9/38; G06F 9/3802; G06F 9/381; G06F 9/3822; G06F 9/3824; G06F 9/3826; G06F 9/383; G06F 9/3836; G06F 9/3853; G06F 9/3857; G06F 9/3859; G06F 9/3863; G06F 9/3867; G06F 9/3869; G06F 9/3885; G06F 9/3887; G06F 9/3889; G06F 9/3893; H01L 2924/1431; H01L 2924/15311; H01L 2224/08; H01L 2924/00014; H01L 21/8221; H01L 24/80; H01L 25/0657; H01L 23/544; H01L 2924/1436; G03F 1/84; G03F 1/36; G03F 7/70633
USPC .................................................. 716/110–118
See application file for complete search history.

(56) References Cited

U.S. PATENT DOCUMENTS

| | | | |
|---|---|---|---|
| 7,360,179 | B2 | 4/2008 | Smith et al. |
| 7,774,726 | B2 | 8/2010 | White |
| 8,001,516 | B2 | 8/2011 | Smith et al. |
| 8,549,447 | B2 | 10/2013 | Eisenstadt |
| 8,621,402 | B2 | 12/2013 | Abd Elkader et al. |
| 8,713,507 | B1 | 4/2014 | Noice |
| 8,769,474 | B1 | 7/2014 | Gennari et al. |
| 10,699,050 | B2 | 6/2020 | Wolpert et al. |
| 2011/0072401 | A1 | 3/2011 | Abd Elkader et al. |
| 2013/0254732 | A1 | 9/2013 | Kornachuk et al. |
| 2019/0340326 | A1* | 11/2019 | Huda .................. H01L 21/3212 |
| 2019/0392110 | A1* | 12/2019 | Huda .................. H01L 27/0207 |
| 2020/0134125 | A1 | 4/2020 | Huang et al. |
| 2021/0064719 | A1* | 3/2021 | Wolpert ................ G06F 30/398 |

OTHER PUBLICATIONS

Kahng et al., "A DOE Set for Normalization-Based Extraction of Fill Impact on Capacitances", Proceedings of the 8th International Symposium on Quality Electronic Deisgn, 2007, pp. 1-8.

Kahng et al., "Chip Optimization Through STI-Stress-Aware Placement Pertubations and Fill Insertion", IEEE Transactions on Computer-Aided Design of Integrated Circuits and Systems, vol. 27, No. 7, Jul. 2008, pp. 1241-1252.

Kahng et al., "DOE-Based Extraction of CMP, Active and Via Fill Impact on Capacitances", IEEE Transactions on Semiconductor Manuacturing, vol. 21, No. 1, Feb. 2008, pp. 22-32.

Kahng et al., "Performance-Aware CMP Fill Pattern Optimization", Invited Paper, in Proc. VMIC 2007, pp. 1-10.

Milo et al., "Memristive and CMOS Devices for Neuromorphic Computing", Materials, vol. 166, 2020, pp. 1-33.

Topaloglu, Rasit Onur "Energy-Minimization Model for Fill Synthesis", Proceedings of the 8th International Symposium on Quality Electronic Design, 2007, pp. 1-8.

* cited by examiner

INTEGRATED CIRCUIT DEVELOPMENT USING DENSITY-AWARE BORDER FILL

BACKGROUND

The present invention generally relates to integrated circuit development, and more specifically, to integrated circuit development using density-aware border fill.

The development of an integrated circuit (i.e., chip) involves several stages from design through fabrication. The chip may be subdivided into hierarchical levels to simplify design and testing tasks at different stages. Generally, a cell or macro may be regarded as a sub-section of the chip. For example, each macro may comprise a number of cells. Once the design is finalized, tests may be completed to ensure that design rules established by a foundry are met prior to fabrication. Certain design rules may be applied to sections of the chip. For example, a grid may be overlaid on the chip and each section of the grid (i.e., tile) may be checked for complicity with design rules.

SUMMARY

Embodiments of the present invention are directed to integrated circuit development using density-aware border fill. A non-limiting example computer-implemented method includes setting a fill mode for a border region of a layer of a macro of an integrated circuit. The border region hays a depth defined by a multiple of the size of a tile used to select an area of the integrated circuit for implementation of a design rule check, and the fill mode indicates a fill percentage value or level of fill to be implemented in the border region of the layer of the macro. A fill of the border region of the layer of the macro is performed based on the fill mode, wherein the integrated circuit is finalized and fabricated based on the performing of the fill and passing the design rule check.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
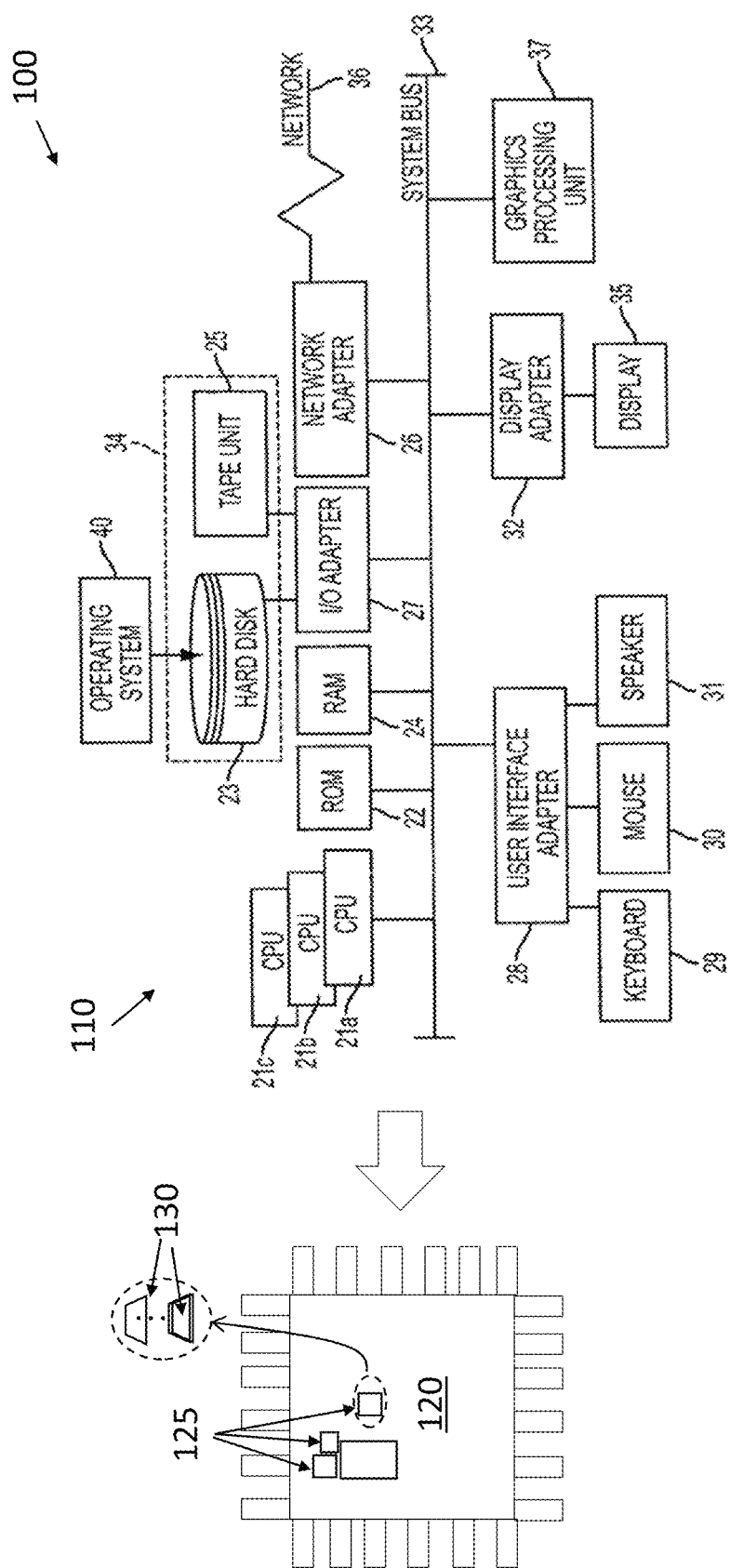
FIG. 1 is a block diagram of a system to perform the development of an integrated circuit using density-aware border fill according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

As previously noted, integrated circuit development may involve several stages from design through fabrication. As also noted, at one or more stages, the integrated circuit design may be subdivided hierarchically for design or testing tasks. For example, the integrated circuit may be partitioned into macros that are each made up of cells. The final design must meet design rules in order to be fabricated. The design rules may be applied to portions of the integrated circuit that are defined by tiles arranged in a grid pattern. The tiles may not overlap with hierarchical divisions. For example, a tile that defines an area that is checked for compliance to design rules may encompass portions of multiple cells or macros. One of the aspects of the final design that may be checked is post-fill density. On the one hand, a minimum limit on density may be imposed to ensure that metal (or other fill material) is confined to trenches following the chemical mechanical planarization (CMP) process. On the other hand, a maximum limit on density may be imposed to prevent interconnections that are shorter than process specifications following the CMP process. Thus, density within a tile must be within a range defined by design rules. Because partitions used in the design (e.g., macros, cells) and tiles do not necessarily match up, considering density at a cell or macro level may not result in compliance with post-fill density-related design rules considered for a tile.

One prior approach involves performing fill at the chip level rather than at lower levels (e.g., macro level). However, this approach may delay delivery of the chip to the foundry. This is because the macros may be developed by different entities, and it may take at least 24 hours after receiving the last macro to complete the fill and design rule checking (DRC) process, even if additional time consuming multiple iterations are not needed to address density violations. Another prior approach involves prefilling at the lower levels (e.g., macro level) and performing manual fixes, as needed, at the chip level or creating extra space between blocks (e.g., macros) to avoid interaction and the potential for a density violation. However, these approaches require extra time to make the manual fixes or extra area which is costly and may limit chip performance.

Embodiments of the invention relate to integrated circuit development using density-aware border fill. While the lower hierarchical level discussed for explanatory purposes is the macro level, the processes discussed may be performed at any hierarchical level below the complete integrated circuit level. Further, while the border region of a macro is discussed in particular to detail embodiments of the invention, a fill process may be performed for other areas of a macro before, after, or during the fill of the border region. The fill is performed at the lower level (e.g., macro level) in consideration of the density of bordering macros. This awareness of the density of nearby macros is facilitated by floorplanning. Floorplanning refers to the initial tentative placement of major functional blocks of the integrated circuit. By controlling fill at the border region of each macro based on awareness of the density of surrounding macros, density within a given tile may be controlled to comply with design rules (i.e., pass the design rule check (DRC)), as detailed.

FIG. 1 is a block diagram of a system 100 to perform the development of an integrated circuit 120 using density-aware border fill according to one or more embodiments of the invention. Exemplary macros 125 are indicated as being part of the integrated circuit 120. As the expanded view of a macro 125 indicates, each macro 125 has layers 130 that are not visible in the view shown for the integrated circuit 120. The system 100 includes a processing system 110 used to generate the design that is ultimately fabricated into the integrated circuit 120. The steps involved in the fabrication of the integrated circuit 120 are well-known and briefly described herein. Once the physical layout is finalized, based, in part, on using density-aware border fill according to one or more embodiments of the invention, the finalized physical layout is provided to a foundry. Masks are generated for each layer of the integrated circuit based on the finalized physical layout. Then, the wafer is processed in the sequence of the mask order. The processing includes photolithography and etch. This is further discussed with reference to FIG. 5.

The processing system 110 has one or more central processing units (processors) 21a, 21b, 21c, etc. (collectively or generically referred to as processor(s) 21 and/or as processing device(s)). According to one or more embodiments of the present invention, each processor 21 can include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and can include a basic input/output system (BIOS), which controls certain basic functions of processing system 110.

Further illustrated are an input/output (I/O) adapter 27 and a communications adapter 26 coupled to system bus 33. I/O adapter 27 can be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on processing system 110 can be stored in mass storage 34. The RAM 22, ROM 24, and mass storage 34 are examples of memory 19 of the processing system 110. A network adapter 26 interconnects system bus 33 with an outside network 36 enabling the processing system 110 to communicate with other such systems.

A display (e.g., a display monitor) 35 is connected to system bus 33 by display adaptor 32, which can include a graphics adapter to improve the performance of graphics intensive applications and a video controller. According to one or more embodiments of the present invention, adapters 26, 27, and/or 32 can be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 can be interconnected to system bus 33 via user interface adapter 28, which can include, for example, a Super I/O chip integrating multiple device adapters into a single integrated circuit.

According to one or more embodiments of the present invention, processing system 110 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing and has a highly parallel structure that makes it more effective than general-purpose CPUs for algorithms where processing of large blocks of data is done in parallel.

Thus, as configured herein, processing system 110 includes processing capability in the form of processors 21, storage capability including system memory (e.g., RAM 24), and mass storage 34, input means such as keyboard 29 and mouse 30, and output capability including speaker 31 and display 35. According to one or more embodiments of the present invention, a portion of system memory (e.g., RAM 24) and mass storage 34 collectively store an operating system such as the AIX® operating system from IBM Corporation to coordinate the functions of the various components shown in processing system 110.

Figure 2:
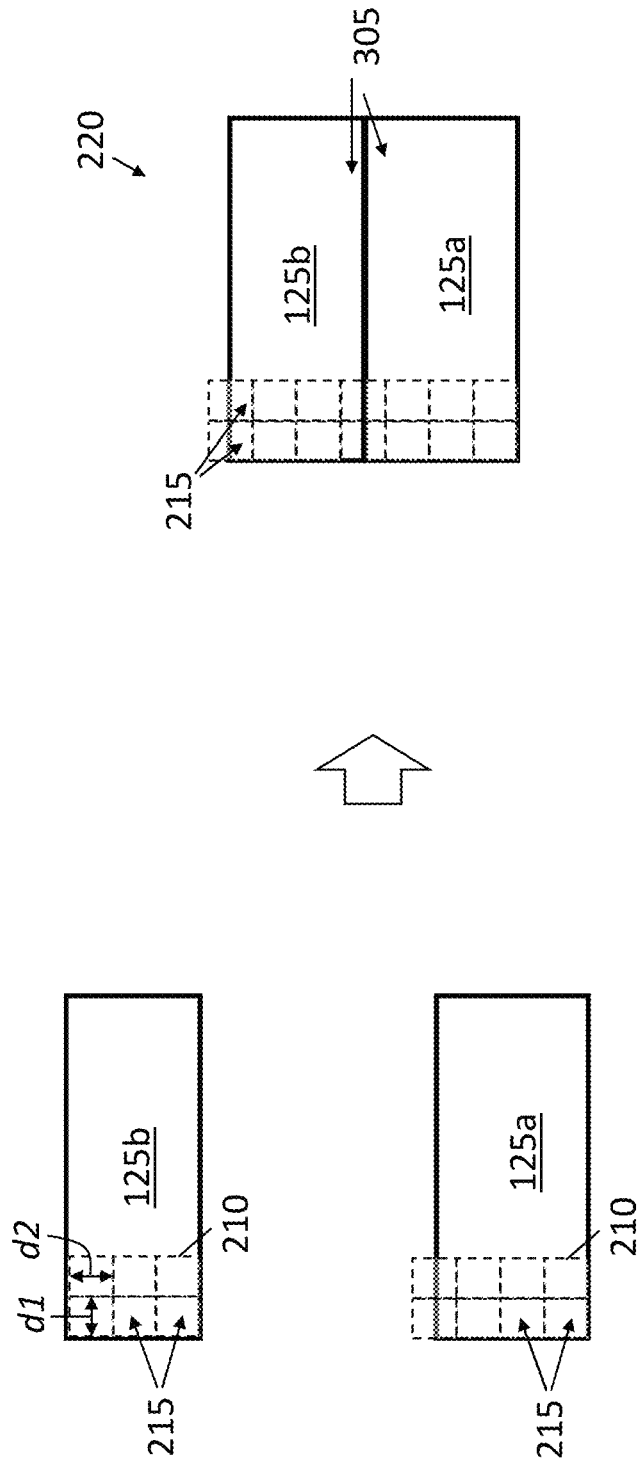
FIG. 2 illustrates aspects of integrated circuit development that are affected by using density-aware border fill according to one or more embodiments of the invention.

FIG. 2 illustrates aspects of the development of an integrated circuit 120 that are affected by using density-aware border fill according to one or more embodiments of the invention. Two exemplary macros 125a, 125b are shown. Each macro 125 is shown with a grid 210 of tiles 215 overlaid on it. The size d1-by-d2 of each tile is indicated. In the exemplary orientation shown in FIG. 2, the width is d1 and the length is d2. As previously noted, one or more DRCs (e.g., density check) may be performed for the chip components within each tile 215. That is, minimum and/or maximum density limit requirements must be met within each tile 215. Thus, the area encompassed by each tile 215 is indicated for each of the macros 125a, 125b individually. Generally, the corner of the grid 210 of tiles 215 may be initially placed to align with a macro corner, as indicated for each macro 125a, 125b, and then moved in stages to cover the entire macro 125, for example. At each stage and each corresponding position of the grid 210, the DRCs may be performed for the area of the macro 125 encompassed by each tile 215. The DRC relevant to one or more embodiments of the invention relates to density (e.g., whether density within a tile 215 is between predefined minimum and maximum densities).

As indicated, the macros 125a, 125b are put together to create a higher-level device 220 (e.g., the chip if the higher hierarchical level is the chip level) according to a result of floorplanning. As shown, the area of the macro 125a that corresponds with each tile 215 remains the same in the higher-level device 220. However, the area of the macro 125b that corresponds with each tile 215 is different in the higher-level device 220 as compared with the area encompassed by each tile 215 when the macro 125b is considered individually. As FIG. 2 illustrates, if the fill of the macro 125b is controlled at the macro level to pass the post-fill density DRC, those DRC results may not be valid in the higher-level device 220. In the exemplary case shown in FIG. 2, a portion of the top border region 305 of macro 125a and a portion of the bottom border region 305 of macro 125b combine to make up the area within a set of tiles 215 overlaid on the higher-level device 220. Thus, at those border regions 305, passing the post-fill density DRC requires considering density around both the top border region 305 of the macro 125a and the bottom border region 305 of the macro 125b. Density-aware border fill in consideration of this scenario, according to one or more embodiments of the invention, is further discussed with reference to FIGS. 3 and 4.

Figure 3:
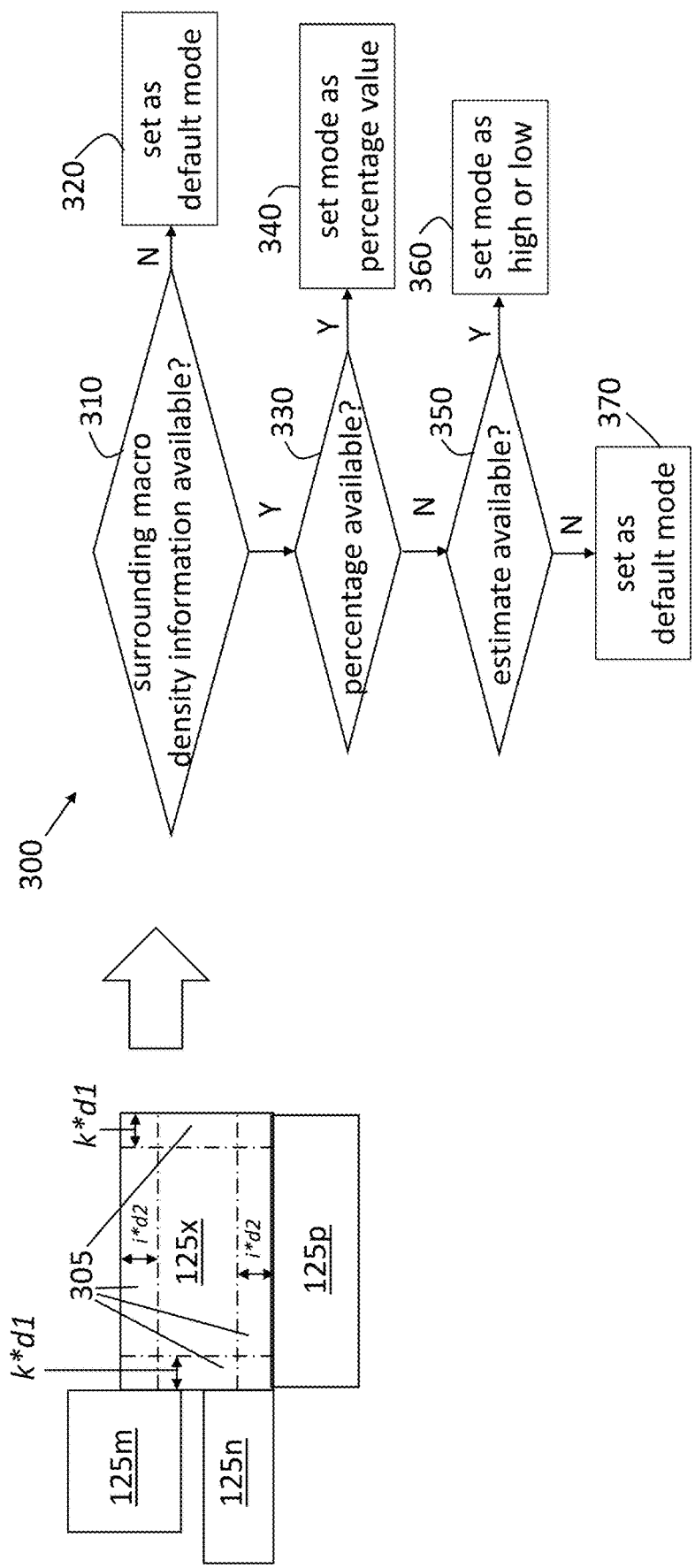
FIG. 3 is a process flow of a method of setting a mode to affect density-aware border fill in the development of an integrated circuit according to one or more embodiments of the invention.

FIG. 3 shows the process flow of a method 300 of setting a mode to affect density-aware border fill in the development of an integrated circuit 120 according to one or more embodiments of the invention. The processes are performed for each layer 130 of one or more macros 125. In addition, each border region 305 is considered individually. As detailed, portions of a border region 305 may be considered separately. An exemplary macro 125x is shown for explanatory purposes. The four border regions 305 of the macro 125x are indicated and are referenced according to the exemplary orientation shown in FIG. 3. The depth of each border region 305 corresponds to the associated dimension d1 or d2 of a tile 215, as indicated. The depth may be a multiple (e.g., k*d1 or i*d2) of a corresponding dimension d1 or d2 of a tile 215, as indicated. The values of k and i may be the same or different, and both k and i may be 1. In the exemplary illustration, the thickness of the left and right border regions 305 is k*d1, a multiple of the exemplary width of a tile 215 (per FIG. 2), and the thickness of the top and bottom border regions 305 is i*d2, a multiple of the exemplary length of a tile 215. Based on a result of the floorplanning, which tentatively places the macros 125 relative to each other, macros 125m and 125n are adjacent to the left border region 305 of the macro 125x, and macro 125p is adjacent to the bottom border region 305 of the macro 125x. The processes of the method 300 are discussed with reference to macro 125x for explanatory purposes.

At block 310, a check is done of whether density information is available for surrounding macros 125. In the exemplary case, when the processes of the method 300 are performed for macro 125x, the check would determine if density information is available for macros 125m, 125n, and 125p. If the check at block 310 indicates that density information is not available for any surrounding macros 125, then the mode is set as the default mode at block 320. If the check at block 310 indicates that density information is available for one or more surrounding macros 125, then a check is done, at block 330, of whether density information is available as a percentage of area for the one or more surrounding macros 125. For example, the fill density of macro 125m may be known to be 70 percent (i.e., 70 percent of the area of macro 125m is filled).

If the check at block 330 indicates that density information is available as a percentage of the area for one or more of the surrounding macros 125, then the mode is set for an associated border region 305 as a percentage value, at block 340. In the exemplary case of macro 125x, a portion of the left border region 305 borders macro 125m, another portion of the left border region 305 borders macro 125n, and the bottom left portion of the macro 125m, where the left and bottom border regions 305 overlap, borders both macro 125n and macro 125p. Thus, for example, if the fill density of macro 125m is available as 70 percent (based on the check at block 330), then the mode for the portion of the left border region 305 of macro 125m that borders macro 125m is set, at block 340, as a complementary percentage value (e.g., 30 percent). The relationship between the percentage for the surrounding macro 125 (from block 330) and the percentage value set as the mode (at block 340) is predefined (e.g., a predefined computation) and is not limited by the example.

If the check at block 330 indicates that density information is not available as a percentage for one or more of the surrounding macros 125, then another check is done at block 350. The check at block 350 determines if an estimate (e.g., low density, high density) is available instead for the one or more surrounding macros 125. If the check at block 350 indicates that an estimate of the fill density is available, then the mode for the associated border region 305 (or portion of a border region 305) is set as high or low accordingly. That is, the mode is set as a level based on a predefined correspondence with the density of an adjacent macro 125. For example, if the check at block 350 determines that the fill density for macro 125p is available as an estimate (e.g., high), then the mode for the bottom border region 305 of the macro 125x may be set, at block 360, as low. The setting at block 360 (e.g., low) may be the opposite of the estimate obtained at block 350 (e.g., high) to ensure that the combination (e.g., of the bottom border region 305 of macro 125x and macro 125p) passes the density fill DRC even if a tile 215 spans part of the bottom border region 305 of the macro 125x and part of the macro 125p.

For any remaining surrounding macros 125, for which fill is not available as a percentage (per the check at block 330) or as an estimate (per the check at block 350), the corresponding border region 305 of the subject macro 125 is set as a default mode. Border regions 305 with no adjacent macro 125 (e.g., top and right border regions 305 of macro 125x) may be set as a default mode, as well. As previously noted, the processes may be repeated for different layers 130 of different macros 125. As discussed with reference to FIG. 4, the mode information may then be used to perform density-aware border fill according to one or more embodiments of the invention.

Figure 4:
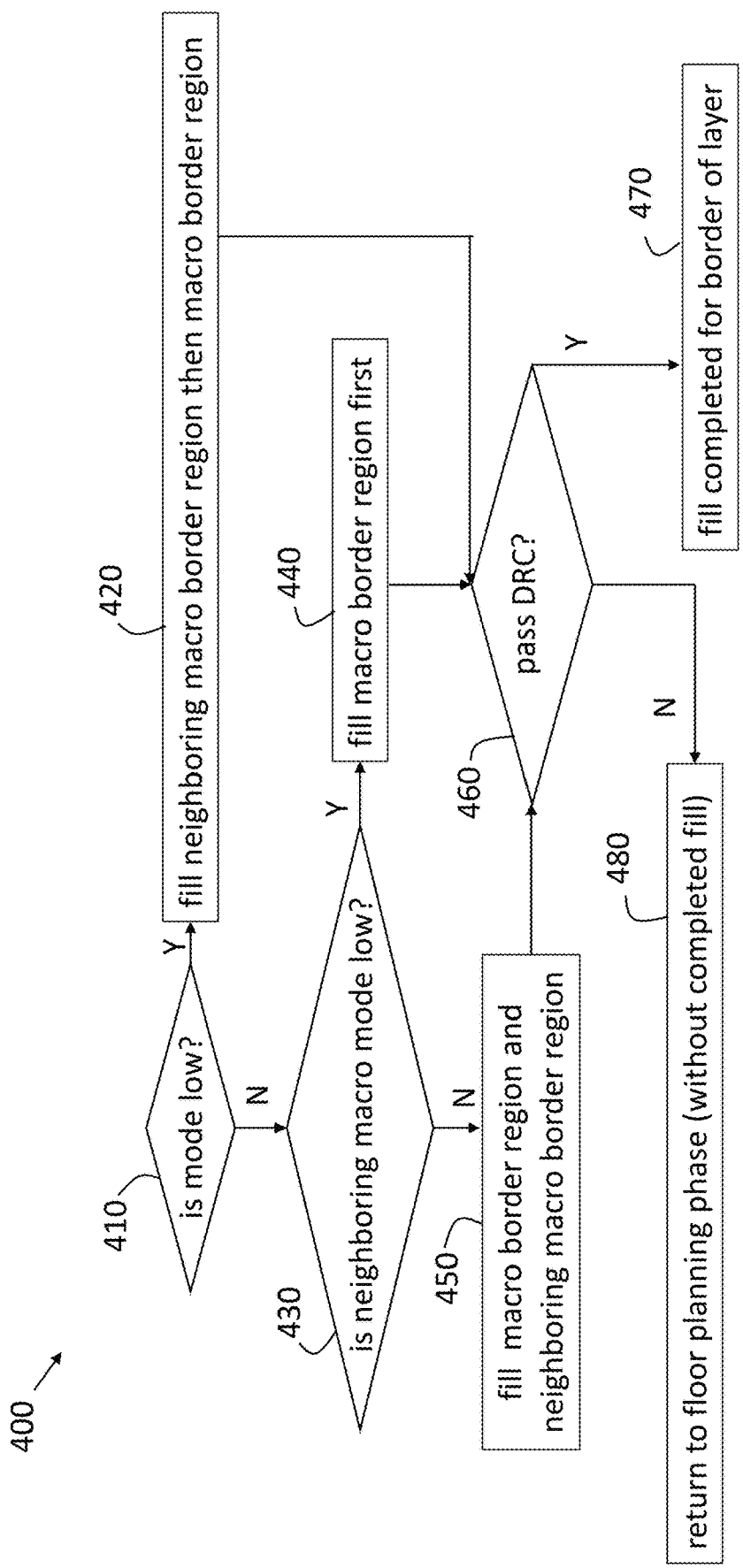
FIG. 4 is a process flow of a method of performing density-aware border fill in the development of an integrated circuit according to one or more embodiments of the invention.

FIG. 4 is a process flow of a method 400 of performing density-aware border fill in the development of an integrated circuit 120 according to one or more embodiments of the invention. Macro 125x shown in FIG. 3 will be discussed as an exemplary macro 125 for explanatory purposes. The processes shown in FIG. 4 may be used to address cross-dependency in the process of performing the fill. That is, not only the mode of a given border region 305 of a given macro 125, which is set according to the processes discussed with reference to FIG. 3, but also the mode of surrounding macros 125 may be considered in performing the fill process according to one or more embodiments of the invention. The processes shown in FIG. 4 may be performed for each border region 305 or portion of a border region 305 of each layer 130 of a macro 125.

For a given border region 305 or portion of the border region 305 of a given layer 130 of a given macro 125, at block 410, a check is done of whether the mode is set as low (at block 360). As the discussion with reference to FIG. 3 indicates, the mode being set as low indicates that the neighboring macro 125 has an estimated density that is high. In this case, the fill process is performed for the neighboring macro 125 first and then performed for the given border region 305 of the macro 125, at block 420. For example, if the bottom border region 305 of the macro 125x has a mode setting of low (according to the check at block 410), then the neighboring macro 125p must have an estimated density that is high (per the check at block 350). In this case, at block 420, the fill is completed for the macro 125p and, more particularly, for the adjacent border region 305 of the macro 125p, prior to the fill for the bottom border region 305 of the macro 125x.

If the check at block 410 indicates that the mode for the given border region 305 or portion of the border region 305 of the given layer 130 of the given macro 125 is not low, then a check is performed at block 430. At block 430, the check determines if the mode set for the neighboring macro 125 or, more particularly, the mode set for the adjacent border region 305 of the neighboring macro 125, is low. If so, then, at block 440, the fill is first performed for the given border region 305 or portion of the border region 305 of the given layer 130 of the given macro 125. For example, the given portion of the given border region 305 may be the top left border region 305 of the macro 125x, and the check at block 430 may determine that the mode set for the macro 125m or the right border region 305 of the macro 125m is low. In this case, the fill is first performed for the top left border region 305 of the macro 125x at block 440, prior to the fill for the border region 305 of the macro 125m.

If the check at block 430 indicates that the mode for the neighboring macro 125 is not low, then the processes at block 450 are performed. The processes at block 450 would be reached when neither the given border region 305 or portion of the border region 305 of the given layer 130 of the given macro 125 nor the neighboring macro 125 have a mode setting of low. The mode settings may be high (per block 360) or a percentage value of fill (per block 340) or a default mode (per block 320), for example. At block 450, the border region 305 of the macro 125 and neighboring macro 125 are filled in either order.

Following the fill at any of the blocks 420, 440, 450, a check is performed at block 460. At block 460, the check determines if the post-fill density DRC is passed. If it is, then, at block 470, the fill is deemed completed for the given border region 305 or portion of the border region 305 of the given layer 130 of the given macro 125. If the check at block 460 indicates that performing the fill does not result in passing the DRC related to post-fill density, then the floorplanning phase must be iterated again, at block 480. The floorplanning iteration at block 480 considers the given border region 305 or portion of the border region 305 of the given layer 130 of the given macro 125 and the neighboring macro 125 prior to the fill process.

Figure 5:
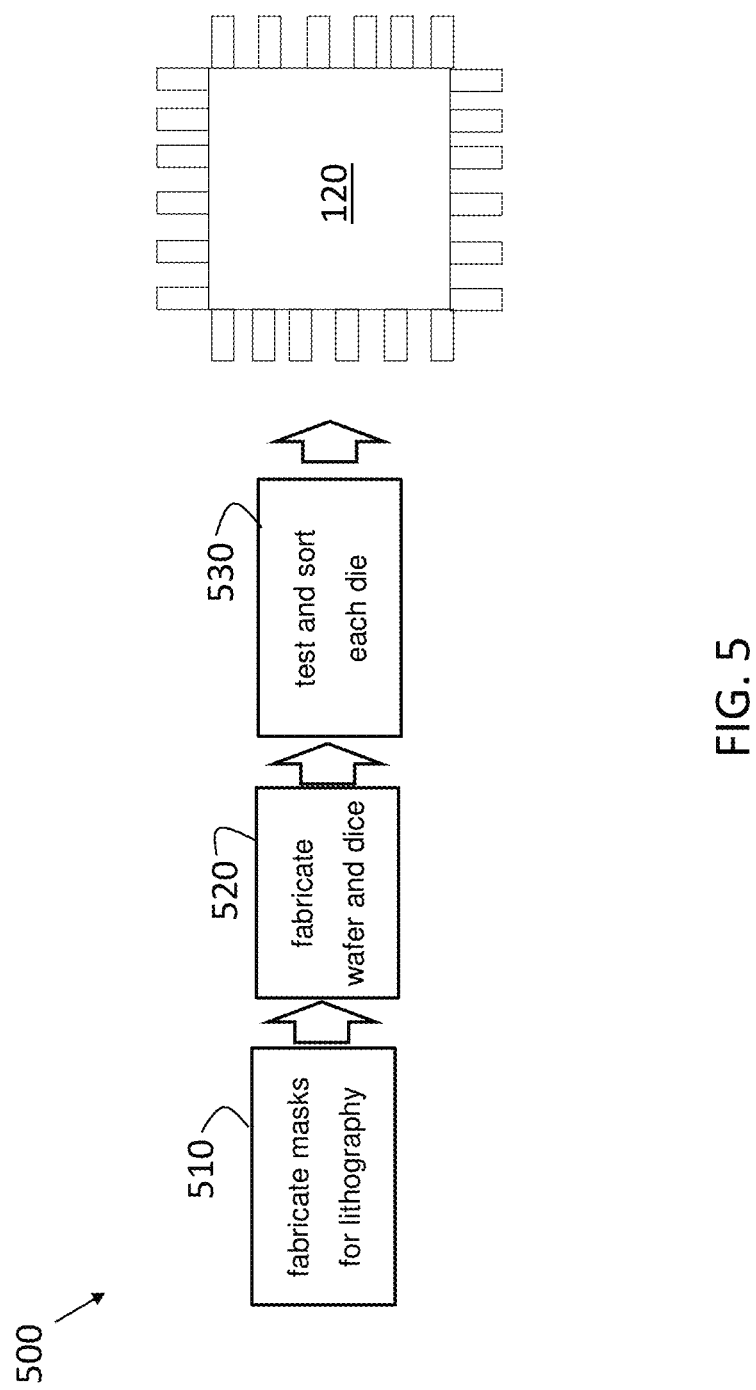
FIG. 5 is a process flow of a method of fabricating the integrated circuit according to exemplary embodiments of the invention.

FIG. 5 is a process flow of a method 500 of fabricating the integrated circuit according to exemplary embodiments of the invention. Once the physical design data is obtained, based, in part, on the processes discussed with reference to FIGS. 3 and 4, the integrated circuit 120 can be fabricated according to known processes that are generally described with reference to FIG. 5. Generally, a wafer with multiple copies of the final design is fabricated and cut (i.e., diced) such that each die is one copy of the integrated circuit 120. At block 510, the processes include fabricating masks for lithography based on the finalized physical layout. At block 520, fabricating the wafer includes using the masks to perform photolithography and etching. Once the wafer is diced, testing and sorting each die is performed, at block 530, to filter out any faulty die.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
defining a plurality of border regions of a layer of a macro of an integrated circuit, wherein a first border region comprises a depth defined by a multiple of a width of a tile used to select an area of the integrated circuit for implementation of a design rule check and a second border region overlapping the first border region comprises a depth defined by a multiple of a length of the tile;
separately setting, for each border region of the plurality of border regions, a fill mode, the fill mode indicating a fill percentage value or level of fill to be implemented in the respective border region of the layer of the macro; and
performing a fill of the border regions of the layer of the macro based on the respective fill modes, wherein the integrated circuit is finalized and fabricated based on the performing of the fill and passing the design rule check.

2. The computer-implemented method according to claim 1, wherein setting the fill mode for a respective border region of the layer of the macro includes determining whether density information is available for a second macro adjacent to the border region of the layer of the macro and setting the fill mode as a default mode based on determining that the density information is not available for the second macro.

3. The computer-implemented method according to claim 2, wherein the setting the fill mode for the border region of the layer of the macro includes determining whether the density information is available as a percentage value based on determining that the density information is available for the second macro and setting the fill mode as the fill percentage value based on a predefined computation using the percentage value based on determining that the density information is available as the percentage value.

4. The computer-implemented method according to claim 2, wherein the setting the fill mode for the border region of the layer of the macro includes determining whether the density information is available as an estimate based on determining that the density information is available for the second macro and setting the fill mode as the level of fill corresponding to the estimate according to a predefined correspondence based on determining that the density information is available as the estimate.

5. The computer-implemented method according to claim 2, wherein the performing the fill of the border region of the layer of the macro is in consideration of a second fill mode of the second macro in addition to being based on the fill mode.

6. The computer-implemented method according to claim 5, wherein the performing the fill of the border region of the layer of the macro includes performing the fill before or after performing a fill of the second macro based on a comparison of the fill mode and the second fill mode.

7. The computer-implemented method according to claim 5, further comprising performing a floor planning process to change an arrangement of the macro and the second macro based on failing the design rule check after the performing the fill.

8. A system comprising:
a memory having computer readable instructions; and
one or more processors for executing the computer readable instructions, the computer readable instructions controlling the one or more processors to perform operations comprising:
defining a plurality of border regions of a layer of a macro of an integrated circuit, wherein a first border region comprises a depth defined by a multiple of a width of a tile used to select an area of the integrated circuit for implementation of a design rule check and a second border region overlapping the first border region comprises a depth defined by a multiple of a length of the tile;
separately setting, for each border region of the plurality of border regions, a fill mode, the fill mode indicating a fill percentage value or level of fill to be implemented in the respective border region of the layer of the macro; and
performing a fill of the border regions of the layer of the macro based on the respective fill modes, wherein the integrated circuit is finalized and fabricated based on the performing of the fill and passing the design rule check.

9. The system according to claim 8, wherein setting the fill mode for a respective border region of the layer of the macro includes determining whether density information is available for a second macro adjacent to the border region of the layer of the macro and setting the fill mode as a default mode based on determining that the density information is not available for the second macro.

10. The system according to claim 9, wherein the setting the fill mode for the border region of the layer of the macro includes determining whether the density information is available as a percentage value based on determining that the density information is available for the second macro and setting the fill mode as the fill percentage value based on a predefined computation using the percentage value based on determining that the density information is available as the percentage value.

11. The system according to claim 9, wherein the setting the fill mode for the border region of the layer of the macro includes determining whether the density information is available as an estimate based on determining that the density information is available for the second macro and setting the fill mode as the level of fill corresponding to the estimate according to a predefined correspondence based on determining that the density information is available as the estimate.

12. The system according to claim 9, wherein the performing the fill of the border region of the layer of the macro is in consideration of a second fill mode of the second macro in addition to being based on the fill mode.

13. The system according to claim 12, wherein the performing the fill of the border region of the layer of the macro includes performing the fill before or after performing a fill of the second macro based on a comparison of the fill mode and the second fill mode.

14. The system according to claim 12, wherein the operations also include performing a floor planning process to change an arrangement of the macro and the second macro based on failing the design rule check after the performing the fill.

15. A computer program product comprising a computer readable storage medium having program instructions embodied therewith, the program instructions executable by a processor to cause the processor to perform operations comprising:
defining a plurality of border regions of a layer of a macro of an integrated circuit, wherein a first border region comprises a depth defined by a multiple of a width of a tile used to select an area of the integrated circuit for implementation of a design rule check and a second border region overlapping the first border region comprises a depth defined by a multiple of a length of the tile;
separately setting, for each border region of the plurality of border regions, a fill mode, the fill mode indicating a fill percentage value or level of fill to be implemented in the respective border region of the layer of the macro; and
performing a fill of the border regions of the layer of the macro based on the respective fill modes, wherein the integrated circuit is finalized and fabricated based on the performing of the fill and passing the design rule check.

16. The computer program product according to claim 15, wherein setting the fill mode for a respective border region of the layer of the macro includes determining whether density information is available for a second macro adjacent to the border region of the layer of the macro and setting the fill mode as a default mode based on determining that the density information is not available for the second macro.

17. The computer program product according to claim 16, wherein the setting the fill mode for the border region of the layer of the macro includes determining whether the density information is available as a percentage value based on determining that the density information is available for the second macro and setting the fill mode as the fill percentage value based on a predefined computation using the percentage value based on determining that the density information is available as the percentage value.

18. The computer program product according to claim 16, wherein the setting the fill mode for the border region of the layer of the macro includes determining whether the density information is available as an estimate based on determining that the density information is available for the second macro and setting the fill mode as the level of fill corresponding to the estimate according to a predefined correspondence based on determining that the density information is available as the estimate.

19. The computer program product according to claim 16, wherein the performing the fill of the border region of the layer of the macro is in consideration of a second fill mode of the second macro in addition to being based on the fill mode, and the performing the fill of the border region of the layer of the macro includes performing the fill before or after performing a fill of the second macro based on a comparison of the fill mode and the second fill mode.

20. The computer program product according to claim 19, further comprising performing a floor planning process to change an arrangement of the macro and the second macro based on failing the design rule check after the performing the fill.

* * * * *